United States Patent [19]

Frommeld

[11] Patent Number: 4,780,393
[45] Date of Patent: Oct. 25, 1988

[54] PHOTOPOLYMERIZABLE COMPOSITION AND PHOTOPOLYMERIZABLE RECORDING MATERIAL CONTAINING SAME

[75] Inventor: Hans-Dieter Frommeld, Wiesbaden, Fed. Rep. of Germany

[73] Assignee: Hoechst Aktiengesellschaft, Fed. Rep. of Germany

[21] Appl. No.: 5,949

[22] Filed: Jan. 22, 1987

[30] Foreign Application Priority Data

Jan. 25, 1986 [DE] Fed. Rep. of Germany ....... 3602215

[51] Int. Cl.$^4$ .................. G03C 1/68; G03C 1/733; G03C 5/16
[52] U.S. Cl. .................. 430/292; 430/293; 430/277; 430/22; 430/325; 430/345; 430/962; 430/915; 430/920; 430/281; 522/14; 522/26; 522/95; 522/121
[58] Field of Search .................. 430/292, 293, 277, 22, 430/325, 345, 962, 915, 920, 281; 522/14, 26, 95, 121

[56] References Cited

U.S. PATENT DOCUMENTS

| | | | |
|---|---|---|---|
| 3,469,982 | 9/1969 | Celeste | 96/35.1 |
| 3,526,504 | 9/1970 | Celeste | 96/35.1 |
| 3,528,926 | 9/1970 | Voorhis | 430/962 |
| 3,804,631 | 4/1974 | Faust | 96/115 |
| 4,225,661 | 9/1980 | Muzyczko | 430/345 |
| 4,241,166 | 12/1980 | Kluepfel et al. | 430/281 |
| 4,251,619 | 2/1981 | Kurita | 430/281 |
| 4,444,869 | 4/1984 | Chonan et al. | 430/962 |
| 4,693,962 | 9/1987 | Tamura et al. | 430/345 |

FOREIGN PATENT DOCUMENTS

| | | |
|---|---|---|
| 0024916 | 3/1981 | European Pat. Off. . |
| 00717789A1 | 2/1983 | European Pat. Off. . |
| 1929375 | 9/1970 | Fed. Rep. of Germany . |
| 3131448 | 2/1983 | Fed. Rep. of Germany . |
| 1154716 | 6/1969 | United Kingdom . |
| 1205781 | 9/1970 | United Kingdom . |

OTHER PUBLICATIONS

Photopolymerizable Composition for Forming Image, vol. 8, No. 175, p. 294 [1612], Aug. 11, 1984, Sekisui Kagaku Kogyo K. K.

*Primary Examiner*—Paul R. Michl
*Assistant Examiner*—Cynthia Hamilton
*Attorney, Agent, or Firm*—Foley & Lardner, Schwartz, Jeffery, Schwaab, Mack, Blumenthal & Evans

[57] ABSTRACT

Upon imagewise exposure, a photopolymerizable composition which contains
(a) a polymeric binder;
(b) a compound that has at least one terminal ethylenic double bond and a boiling temperature, at standard pressure, of above 100° C., and that can form a polymer by polymerization initiated by a free-radical process;
(c) a photoinitiator;
(d) a leuco base of a triarylmethane dye; and
(e) a photochromic spiro-indolino-benzopyran compound represented by the formula

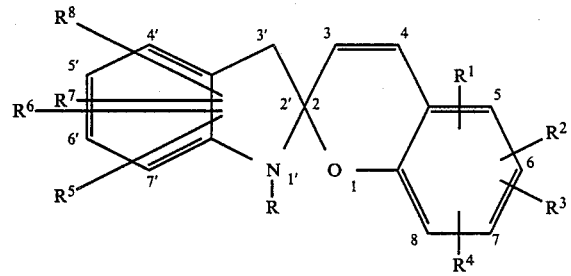

wherein
R denotes a hydrogen atom or a $C_1$-to-$C_{16}$ alkyl group,
$R^1$, $R^2$, $R^3$ and $R^4$ are identical or different, and each denotes a hydrogen or a halogen atom, a $C_1$-to-$C_4$ alkyl or alkoxy group, or a nitro group, and
$R^5$, $R^6$, $R^7$ and $R^8$ are identical or different, and each denotes a hydrogen or a halogen atom, a nitro or an amino group, a $C_1$-to-$C_5$ alkyl or alkoxy group, or a $C_6$-to-$C_{10}$ aryl group exhibits a strong color contrast which is maintained even after prolonged storage.

16 Claims, 2 Drawing Sheets

PHOTOPOLYMERIZABLE COMPOSITION AND PHOTOPOLYMERIZABLE RECORDING MATERIAL CONTAINING SAME

BACKGROUND OF THE INVENTION

The present invention relates to a photopolymerizable composition that comprises (1) a polymeric binder, (2) an ethylenically unsaturated, polymerizable compound, (3) a photoinitiator and (4) a particular type of photochromic spiro-indolinobenzopyran compound.

Compositions containing components (1), (2) and (3) above are used for producing printing plates, relief images and photoresists and are, for example, known from German Pat. Nos. 1,171,267, 2,027,467 and 2,039,861 and from German Offenlegungsschriften No. 15 22 515, No. 20 64 079 and No. 20 64 080 (corresponding to U.S. Pat. No. 3,804,631). They are employed, in particular, as recording materials for the photomechanical production of lithographic printing forms and for photoresist processes.

In the photopolymerizable layers of these compositions or reproduction materials, respectively, dyes or pigments are usually included to improve the visibility of the relief image following development. The colored additives should be lightfast by nature, since the stencil obtained after development, which consists of the light-hardened layer constituents, must exhibit a maximum of contrast. On the other hand, the exposed areas are clearly distinguishable from the unexposed areas immediately after the exposure of photopolymerizable recording materials. To achieve this objective, azo dyes are used, among others, which are bleached out upon exposure. In most cases the images produced using these dyes are very light, i.e., poor in contrast.

German Offenlegungsschrift No. 28 07 933 describes specific azo dyes which are reversibly bleached. When being exposed, they are bleached by down to 50% of the original extinction, resulting in a relatively high image contrast. The images must, however, be developed immediately after exposure, because, especially in the presence of ambient oxygen from the air, the original color density is gradually restored and, hence, the contrast due to exposure disappears.

In accordance with the teaching of European patent application No. 24,916, suitable dyes include triarylmethane dyes, cis- or trans-azobenzenes, thioindigo dyes, o-nitrobenzene derivatives and spiropyran compounds which in positive-working photoresists exhibit photochromic properties.

German Offenlegungsschrift No. 31 31 448 describes photopolymerizable mixtures with binders containing amino or imino groups, which may additionally contain dyes, contrast agents or photochromic compounds. Leuco dyes, such as leuco crystal violet, are mentioned as photochromic compounds. Triphenyl methane dyes and 3'-phenyl-7-dimethylamino-2,2'-spirodi[2H-1-benzopyran] are mentioned, inter alia, as suitable contrast dyes.

SUMMARY OF THE INVENTION

It is therefore an object of the present invention to provide highly photosensitive photopolymerizable compositions that show, immediately after exposure, a strong image contrast which is maintained even after prolonged storage.

It is also an object of the present invention to provide photopolymerizable copying material characterized by a good contrast between the exposed photopolymerizable layer areas and the layer support, in particular copper supports, which is observable after development.

It is still another object of the present invention to provide a photopolymerizable composition that is storable for at least two weeks without changing substantially when the composition is applied, in the form of a photopolymerizable layer, to a copper-containing layer support.

It is yet another object of the present invention to provide a process that is characterized, inter alia by the ease with which correctness of image exposure can be monitored.

In accomplishing the foregoing objects, there has been provided, in accordance with one aspect of the present invention, a photopolymerizable composition comprising
(a) a polymeric binder;
(b) a compound that has at least one terminal ethylenic double bond and a boiling temperature, at standard pressure, of above 100° C., and that can form a polymer by polymerization initiated by a free-radical process;
(c) a photoinitiator;
(d) a leuco base of a triarylmethane dye; and
(e) photochromic spiro-indolino-benzopyran compound represented by the formula

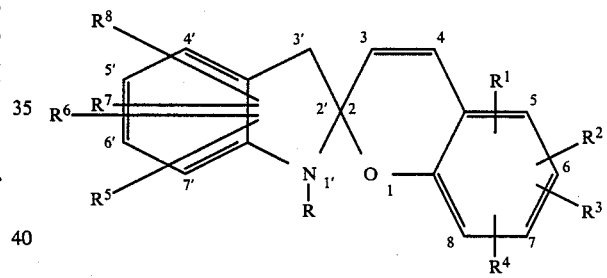

wherein
R denotes a hydrogen atom or a $C_1$-to-$C_{16}$ alkyl group,
$R^1, R^2, R^3$ and $R^4$ are identical or different, and each denotes a hydrogen or a halogen atom, a $C_1$-to-$C_4$ alkyl or alkoxy group, or a nitro group, and
$R^5, R^6, R^7$ and $R^8$ are identical or different, and each denotes a hydrogen or a halogen atom, a nitro or an amino group, a $C_1$-to-$C_5$ alkyl or alkoxy group, or a $C_6$-to-$C_{10}$ aryl group.

In accordance with another aspect of the present invention, a photopolymerizable recording material has been provided which is comprised of a layer support and a photopolymerizable layer provided thereon, which layer is comprised of the above-described composition. In a preferred embodiment, the photopolymerizable layer is provided on the surface of the layer support that is comprised of copper or a copper alloy.

In accordance with another aspect of the present invention, there has been provided a process for recording relief images, comprising the steps of (a) imagewise-exposing a photopolymerizable recording material as described above, whereby a colored image is formed; (b) checking the correctness of the exposure of the recording material by reference to the colored image; and (c) washing out the unexposed portions of the layer.

Other objects, features and advantages of the present invention will become apparent from the following detailed description. It should be understood, however, that the detailed description and the specific examples, while indicating preferred embodiments of the invention, are given by way of illustration only, since various changes and modifications within the spirit and scope of the invention will become apparent to those skilled in the art from this detailed description.

DETAILED DESCRIPTION OF THE PREFERRED EMBODIMENTS

Figure 1:
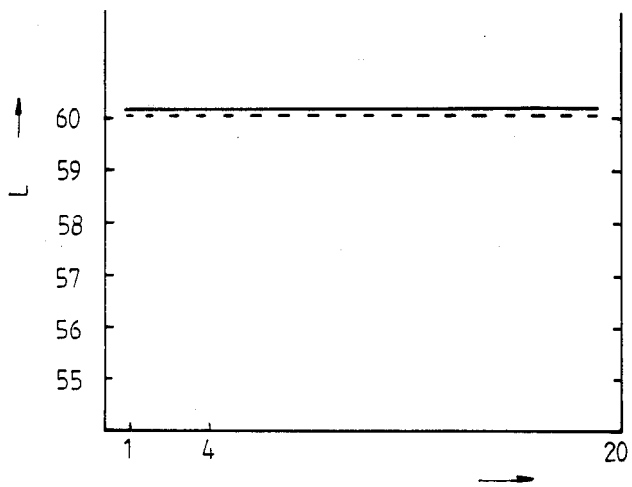
FIGS. 1-4 are graphs that depict, respectively, the relation between brightness values in an image field and time elapsed after exposure for comparison materials (FIGS. 1, 2 and 3) and recording material within the present invention (FIG. 4).

Leuco bases of triarylmethane dyes that are suitable for use in the present invention include, inter alia, those of Crystal Violet, Victoria Blue BH, Victoria Pure Blue BOH, Methyl Violet, Fuchsine, Malachite Green, Acid Violet 5B, Solar Cyanine 6B, Brillant Green and Acilan Violet S.

Of the spiro-[2H-1-benzopyran-2,2'-indolines] corresponding to formula I, both derivatives carrying substituents on the benzopyran ring system and derivatives carrying substituents on the indoline system can be employed in the photopolymerizable compositions of the present invention.

Among the suitable substituted benzopyrans are: 6-Acetyl-, 5-bromo-8-methoxy-6-nitro-, 5-bromo-6-nitro-, 6-bromo-8-nitro-, 8-bromo-6-nitro-, 6-chloro-, 7-chloro-, 6-chloro-5,7-dimethyl-8-nitro-, 8-chloro-5,6-dinitro-, 5-chloro-6-nitro-, 5-chloro-8-nitro-, 6-cyano-, 5,7-dichloro-6-nitro-, 6,8-dichloro-5-nitro-, 5,7-dimethoxy-6-nitro-, 8-fluoro-, 6-fluoro-8-nitro-, 8-fluoro-6-nitro-, 7-hydroxy-, 6-iodo-8-nitro-, 8-iodo-6-nitro-, 7-methoxy-5-methyl-6-nitro-, 6-methoxy-5-nitro-, 8-methoxy-5-nitro-, 8-methoxy-6-nitro-, 5-nitro-, 6-nitro-, 7-nitro-, 8-nitro-, 6-nitro-5,7,8-trimethyl-, 6-($\beta$-nitrovinyl) and 7-methyl-benzopyran.

Suitable substituted indolines include: 1'-butyl-, 3',3'-diethyl-, 3',3'-diphenyl-, 3',7'-diphenyl-, 3'-ethyl-, 1'-hexadecyl-, 1'-isoamyl-, 5'-nitro-3'-phenyl-, 3'phenyl-, 1',3',3'-trimethyl-, 4'-chloro-, 5'-chloro-, 6'-chloro-, 5',7'-dichloro-, 3',3'-trimethyl-5'-chloro-, 4',6'-dimethoxy-, 4',7'-dimethyl-, 5',7'-dimethyl-, 4',6'-diphenyl-, 5',7'-diphenyl-,4'-fluoro-, 5'- fluoro-, 5'-($\beta$-hydroxyethyl), 5'-methoxy-, 7'-methoxy-, 5'-methyl-, 6'-methyl-, 7'-methyl-, 5'-nitro-, 7'-nitro-, 5'-phenyl-, 7'-phenyl- and 4',6',7'-triphenyl-indoline.

If one or several of the radicals $R^1$ to $R^8$ are alkyl groups, these preferably have 1 or 2 carbon atoms, with methyl groups being particularly preferred. R preferably is an alkyl group having, in particular, 1 to 5 carbon atoms; most preferably it is a methyl group.

Compounds of formula I that possess at least one nitro group, especially in the benzopyran system, yield particularly strong color contrasts and, therefore, are preferred.

The suitable spiro-[2H-1-benzopyran-2,2'-indolines] preferably include those which—in accordance with the above-mentioned preferred substituents—carry substituents on both ring systems. Particular preference is given to those substituted compounds that are substituted, in position 1' of the indoline system, by one methyl group and, in position 3' of the indoline system, by two methyl groups, and that in position 6 of the benzopyran system are substituted by a nitro group. Optionally, position 8 of the benzopyran system is additionally substituted by an alkoxy group, in particular, a methoxy group.

Additional suitable spiro-indolino-benzopyrans are described by G. H. Brown in PHOTOCHROMISM, Wiley-Interscience, New York (1971), at pages 165-69, particularly page 169, the contents of which are hereby incorporated by reference.

The amount of leuco base contained in a photopolymerizable composition of the present invention preferably varies between 0.05 and 5.0 percent by weight, preferably between 0.4 and 4.0 percent by weight, relative to the nonvolatile constituents of the composition. The corresponding content of spiro compound generally varies between 0.01 and 2.0 percent by weight, preferably between 0.05 and 1.0 percent by weight, relative to the nonvolatile constituents of the composition. The preferred ratio of leuco base to spiro compound ranges from 12:1 to 2:1.

A large number of substances can be used as photopolymerization initiators in a composition according to the present invention. Examples are benzophenone, thioxanthone, benzoin and their derivatives.

Among these substances, preference is given to heterocyclic compounds having 2 to 5 fused rings and at least one nitrogen atom as a heteroatom, in particular acridine derivatives, such as 9-phenylacridine, 9-p-methoxyphenylacridine, 9-acetylaminoacridine and benz(a)acridine; quinoline derivatives, such as 2-styrylquinoline and cinnamylidene-quinaldine; phenazine derivatives like 9,10-dimethyl-benz(a)phenazine and 10-methoxy-benz(a)phenazine; quinoxaline derivatives, for example, 6,4',4''-trimethoxy-2,3-diphenylquinoxaline and 4',4''-dimethoxy-2,3-diphenyl-5-azaquinoxaline; and quinazoline derivatives. These preferred initiators are described in German patent No. 20 27 467, and are represented by the formula

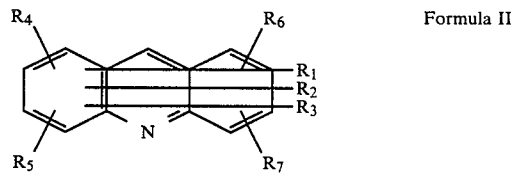

Formula II or

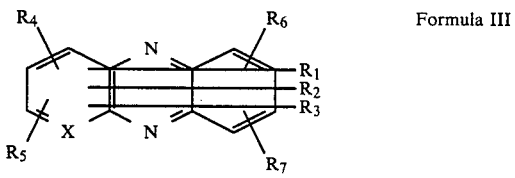

Formula III in which $R_1$, $R_2$, and $R_3$ are selected from the group consisting of hydrogen, halogen, alkyl, alkoxy, aryl, aryloxy, amino, acylamino, and aralkeny groups, $R_4$, $R_5$, $R_6$ and $R_7$ are H or annelated benzene rings, with no more than two annelated benzene rings being present per molecule, however, and X is selected from the group consisting of in German Pat. No. 20 39 861, and are represented by the formula

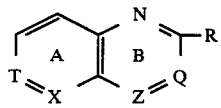

Formula IV in which

Z and Q are different from one another and each represents either a nitrogen atom or the group C—R', X and T are the same or different and represent a nitrogen atom or the group C—R", R and R' are the same or different and represent aliphatic, aromatic or heterocyclic groups and R" represents hydrogen or an organic group of the nucleus A carrying a further group of the significance of R" or an annellated benzene ring; and in prior German patent application No. 35 37 380, and are represented by the formula

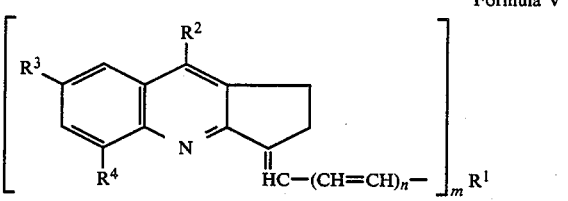

Formula V in which $R^1$ is a substituted or unsubstituted m-valent, carbocyclic aromatic or heterocyclic aromatic radical, $R^2$ is an alkyl group, an aryl group, an aralkyl group or an aralkenyl group, $R^3$ and $R^4$ are identical or different, and each denotes a hydrogen atom, a halogen atom, an alkyl group or an alkoxy group, n is 0 or 1, and m is 1 or 2.

The initiators are generally employed in an amount ranging from 0.01 to 10.0 percent by weight, preferably from 0.05 to 4.0 percent by weight, relative to the nonvolatile constituents of the composition.

Polymerizable compounds useful for the purpose of this invention are known and are described, for example, in U.S. Pat. Nos. 2,760,863 and 3,060,023. Preferred examples are acrylic and methacrylic acid esters of dihydric or polyhydric alcohols, such as ethylene glycol diacrylate, polyethylene glycol dimethacrylate, acrylates and methacrylates of trimethylol ethane, trimethylol propane, pentaerythritol, dipentaerythritol, and of polyhydric alicyclic alcohols. Reaction products of diisocyanates with partial esters of polyhydric alcohols are also used advantageously. Monomers of this kind are described in German Offenlegungsschriften Nos. 20 64 079, 23 61 041 and 28 22 190. The proportion of monomers contained in the layer generally varies between about 10 and 80, preferably 20 and 60, percent by weight.

A large number of soluble organic polymers can be employed as binders. Examples are: polyamides, polyvinyl esters, polyvinyl acetals, polyvinyl ethers, epoxide resins, polyacrylic acid esters, polymethacrylic acid esters, polyesters, alkyd resins, polyacrylamide, polyvinyl alcohol, polyethylene oxide, polydimethyl acrylamide, polyvinyl pyrrolidone, polyvinylmethyl formamide, polyvinylmethyl acetamide, and copolymers of the monomers which form the enumerated homopolymers. Other suitable binders are natural substances or modified natural substances, for example, gelatin or cellulose ethers.

With particular advantage, binders are used that are insoluble in water but that are soluble, or at least swellable, in aqueous-alkaline solutions, since layers containing such binders can be developed with the preferably employed aqueous-alkaline developers. Binders of this type can, for instance, contain the following groups: —COOH, —PO$_3$H$_2$, —SO$_3$H, —SO$_2$NH, —SO$_2$—NH—SO$_2$— and —SO$_2$—NH—CO. Examples of these binders are maleate resins, polymers of β-methacryloyloxy-ethyl-N-(p-tolylsulfonyl)-carbamate and copolymers of these and similar monomers with other monomers, vinyl acetate/crotonic acid copolymers and styrene /maleic acid anhydride copolymers. Copolymers of alkylmethacrylates and methacrylic acid and copolymers of methacrylic acid, higher alkyl methacrylates and methyl methacrylate and/or styrene, acrylonitrile, and the like, which are described in German Offenlegungsschriften Nos. 20 64 080 and 23 63 806, are preferably used. It is also preferred that the water-insoluble, aqueous-alkaline-swellable binders used in the present invention have an acid number of 50 to 350.

In general, the quantity of binder added ranges between about 20 to 90% by weight, preferably 40 to 80% by weight, of the layer constituents.

Depending on their intended use and desired properties, the photopolymerizable compositions of the present invention can contain various additional substances. Examples of these admixtures are:

inhibitors to prevent thermal polymerization of the monomers, hydrogen donors, substances regulating the sensitometric properties of layers of this type, dyes, colored and uncolored pigments, and plasticizers, such as polyglycols or esters of p-hydroxylbenzoic acid.

These constituents advantageously should be selected to minimize absorption in the region of actinic radiation, which is important for the initiation process.

In the context of this description, actinic radiation is to be understood as any radiation, the energy of which corresponds at least to that of shortwave visible light. Longwave UV-radiation and laser radiation are also suitable.

The photopolymerizable composition of the present invention can be used in many applications, such as in the production of varnishes which are hardened by the action of light and, in particular, in a light-sensitive copying material used for reproduction purposes.

Although the present description focuses to an extent on this last field of application, the present invention is not limited thereto. Examples of applications for the present invention in the reproduction field are: recording layers for the photomechanical production of printing plates suitable for relief printing, lithographic printing, gravure printing, or screen printing; relief copies, for example, in the production of Braille books; single copies; tanned images and pigment images. The compositions of the present invention can also be employed for the photomechanical production of etch resists, for example, for name plates, printed circuits, and chemical milling. The compositions of this invention are of particular importance with regard to the photomechanical production of lithographic printing plates and to photoresist technology.

A composition within the present invention can be used industrially for the above-mentioned applications as a liquid solution or dispersion, for example, a photoresist solution, which is applied by the consumer to an appropriate support, for example, for chemical milling, for the production of printed circuits, screen printing stencils, etc. The composition can also be present as a solid light-sensitive layer coated on a suitable support, i.e., as a storable, photosensitive copying material, for example, for the production of printing plates. It can also be employed for the production of dry resists.

It is generally advantageous substantially to isolate the compositions of the present invention from the influence of atmospheric oxygen during light polymerization. If the composition is used in the form of a thin copying layer, it is recommended that a suitable cover film with a low permeability to oxygen be applied to the layer. The cover film may be self-supporting and removable from the copying layer prior to development. Polyester films, for example, are suitable for this purpose. The cover film may also comprise a material that dissolves in the developer liquid or that can be removed at least from the nonhardened areas during development. Examples of materials suitable for this purpose are, inter alia, waxes, polyvinyl alcohol, polyphosphates and sugars.

Layer supports which are suitable for copying materials prepared using the composition of the present invention include, for example, aluminum, steel, zinc, copper, plastic films, such as films of polyethylene terephthalate or cellulose acetate, and screen printing supports, such as perlon gauze.

The light-sensitive materials employing the composition of this invention are conventionally prepared. Thus, the composition can be taken up in a solvent, and the resulting solution or dispersion can be applied to the intended support as a thin film by casting, spraying, immersion or roller application, and subsequently dried. Thick layers (for example, 250 µm and thicker) are advantageously prepared by first producing a self-supporting film by extrusion or molding, which is then optionally laminated to the support. In the case of dry resists, solutions of the composition are applied to transparent intermediate supports and dried. The light-sensitive layers, having a thickness between about 10 and 100 µm, are then also bonded to the desired support by lamination, along with the temporary support.

The copying materials can be processed using known methods. They are developed by treatment with an appropriate developer solution, for example, a solution of organic solvents, but preferably with a weakly alkaline aqueous solution, whereby the unexposed areas of the layer are dissolved away and the exposed areas of the copying layer remain on the support.

On exposure, the materials prepared according to the present invention immediately exhibit a clearly visible color contrast, due to an intensive coloring of the exposed areas. During storage in the dark, the color contrast is preserved almost unchanged and is maintained over quite a number of days and even weeks. The photosensitivity of the photopolymerizable composition remains virtually unaffected by contrast-provoking additives.

Surprisingly, the desired effect is only achieved when spiro compounds represented by formula I are employed in the composition according to the invention. For example, the 3'-phenyl-7-dimethylamino-2,2'-spirodi[2H-1-benzopyran]dye mentioned in German Offenlegungsschrift No. 31 31 448, which dye has a structure that is similar to that of the formula I spiro compounds described above, does not undergo any photochromic color change in the composition, whether it is used alone or in combination with a leucotriarylmethane dye. In contrast, if a formula I compound is used alone, i.e., without the addition of a leuco base, the coloring rpidly decreases after the imagewise exposure, and within the course of a few hours it practically disappears. If the leuco base is used alone, practically no image contrast is visible immediately after exposure. A marked image contrast manifests itself only after a certain period of storage in the dark, with the maximum intensity reached after approximately one day.

The following examples illustrate preferred embodiments of the present invention. Quantitative ratios and percentages are to be understood as weight units, unless otherwise stated. As a rule, the amounts of the individual constituents are expressed in parts by weight (p.b.w.).

EXAMPLE 1

Solutions 1a to 1f were prepared by first preparing a stock solution comprised of 20 p.b.w. of the reaction product obtained from 1 mole of 2,2,4-trimethyl-hexamethylene diisocyanate and 2 moles of 2-hydroxyethylmethacrylate, 20 p.b.w. of a terpolymer of styrene, n-hexylmethacrylate and methacrylic acid (10:60:30) having an acid number of 190, 0.02 p.b.w. of 1,4-bis-(4-tert.butoxy-phenylamino)-5,8-dihydroxyanthraquinone, and 0.2 p.b.w. of 9-phenylacridine, in 46 p.b.w. of butanone and 23 p.b.w. of ethanol, to which one of the following constituents was added in each case:

1a (C): no admixture 1b (C): 0.04 p.b.w. of 3'-phenyl-7-dimethyl-amino-2,2'-spirodi[2H-1-benzopyran], 1c (C): 0.04 p.b.w. of 1',3',3'-trimethyl-6-nitro-8-methoxy-spiro-[2H-1-benzopyran-2,2'-indoline], 1d (C): 0.35 p.b.w. of leuco-crystal violet, 1e (C): 0.35 p.b.w. of leuco-crystal violet and 0.04 p.b.w. of 3'-phenyl-7-dimethyl-amino-2,2'-spirodi-[2H-1-benzopyran], 1f: 0.35 p.b.w. of leuco-crystal violet and 0.04 p.b.w. of 1',3',3'-trimethyl-6-nitro-8-methoxy-spiro-[2H-1-benzopyran]-2,2'-indoline].

C = Comparison

Each of these solutions was applied to 25 µm-thick polyethylene terephthalate film, with subsequent drying at 100° C. in a drying cabinet for 2 minutes. Dry resist layers having a weight of 50 g/m$^2$ were obtained.

For protection from dust and mechanical damage, the dry resist layers were covered with a 20 µm-thick covering film of polyethylene, which adhered less strongly to the resist layer than did the polyester film. The materials thus obtained could be stored over a prolonged period, provided that light was excluded.

After removal of the covering film, the dry resist layers were laminated, at a temperature of 120° C. and an advance speed of 1.5 m/min., to a precleaned copper foil bonded to a rigid epoxide/glass fiber laminate, using a commercially available laminator.

Samples 1a to 1f of the resist material laminated onto the copper surface were then exposed through the support film, under an original comprising a transparent field of 4×4 cm, a dark field of 4×4 cm, a line pattern and a 13-step exposure wedge having density increments of 0.15. In each case, exposure was performed for 5 seconds, by means of an iron-doped 5 kW halide lamp, at a distance of 90 cm.

The brightness values of the 4×4 cm fields, i.e., the light remitted by these fields, were then measured by means of a HUNTERLAB color tester. The L-value is a measure of brightness (100=ideal white, 0=ideal black). The L-values determined for the different compositions are compiled in Table 1.

TABLE 1

L-values of layers a–f, determined as a function of the time elapsed after exposure

| time after exposure (hours) | 0 | 0.5 | 1 | 4 | 20 |
| --- | --- | --- | --- | --- | --- |
| a unexposed | 60.5 | 60.5 | 60.4 | 60.4 | 60.5 |
| a exposed | 60.5 | 60.5 | 60.5 | 60.4 | 60.4 |
| b unexposed | 60.1 | 60.1 | 60.0 | 60.1 | 60.1 |
| b exposed | 60.0 | 60.1 | 60.1 | 60.0 | 60.0 |
| c unexposed | 59.1 | 59.1 | 59.0 | 59.0 | 59.0 |
| c exposed | 54.0 | 54.6 | 55.1 | 56.4 | 58.8 |
| d unexposed | 56.3 | 56.2 | 56.0 | 55.9 | 55.5 |
| d exposed | 56.0 | 55.1 | 54.2 | 52.3 | 50.4 |
| e unexposed | 56.2 | 56.1 | 55.9 | 55.8 | 55.5 |
| e exposed | 56.2 | 55.1 | 54.0 | 52.2 | 50.2 |
| f unexposed | 55.2 | 55.1 | 55.0 | 54.8 | 54.7 |
| f exposed | 49.9 | 49.8 | 49.6 | 49.4 | 49.2 |

Conclusions:

1b: The comparative compound 1b (3'-phenyl-7-dimethylamino-2,2'-spirodi-[2H-1-benzopyran]) was ineffective, both when used alone (FIG. 1) and when used in combination with the leuco base (1e).

Figure 2:
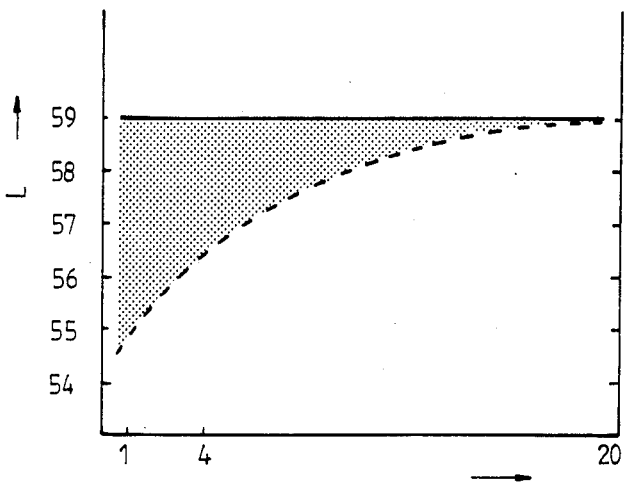

1c: The compound 1c (1',3',3'-trimethyl-6-nitro-8-methoxyspiro-[2H-1-benzopyran-2,2'-indoline]) gave a good contrast immediately after exposure, but this contrast did not last (FIG. 2).

Figure 3:
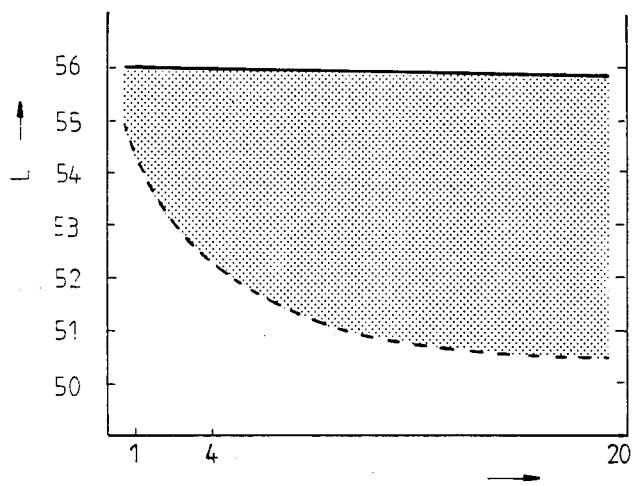

1d: With leuco crystal violet alone, an acceptable contrast was reached only after several hours (FIG. 3).

Figure 4:
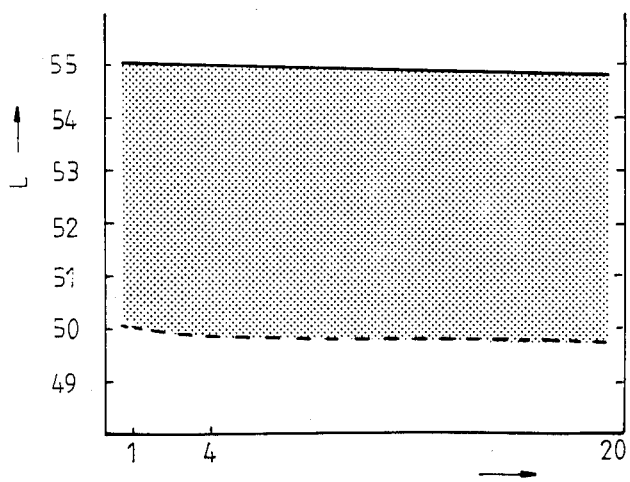

1f: The composition of the present invention provided a substantially uniform contrast, independent of the time (FIG. 4).

Additional samples of plates 1a to 1f were then exposed as described above and, after the support film had been peeled off, were developed by spraying with 0.8% strength sodium carbonate solution at 25° C. for 60 seconds.

The photosensitivity had not been affected by the additives. In each of the 6 samples, steps 1 to 4 of the continuous tone step wedge were completely hardened, and steps 7 to 12 were completely developed. The best contrast relative to the copper was observed in the case of sample 1f, prepared in accordance with the present invention.

EXAMPLE b 2

Coating solutions comprised of
100 p.b.w. of trimethylolpropane triacrylate,
100 p.b.w. of a terpolymer of n-hexylmethacrylate, n-butoxymethylmethacrylamide and methacrylic acid (50:25:25) having an acid number of 163,
1200 p.b.w. of 2-methoxyethanol,
200 p.b.w. of butanone,
1 p.b.w. of 3-benzylidene-9-methyl-2,3-dihydro1H-cyclopenta(b)quinoline and either
(a)(C) 2 p.b.w. of 3'-phenyl-7-dimethylamino-2,2'-soirodi[2H-1-benzopyran] or
(b) (C) 2 p.b.w. of 1',3',3'-trimethyl-6-nitro-8-methoxyspiro[2H-1-benzopyran-2,2'-indoline] or
(c)(C) 6 p.b.w. of leuco crystal violet or
(d)(C) 6 p.b.w. of leuco crystal violet and 2 p.b.w. of 1',3',3'-trimethyl-6-nitro-8-methoxyspiro[2H-1-benzopyran-2,2'-indoline]

were spin-coated onto electrolytically grained and anodically oxidized, 0.3 mm-thick aluminum and dried at 100° C. for two minutes, such that a layer weight of 2.4 g/m² was obtained in each case. Thereafter the photosensitive plates were coated with a 15% strength aqueous solution of polyvinyl alcohol (12% residual acetyl groups, K-value 4) and dried again (coating weight 4–5 g/m²).

The printing plates thus obtained were exposed for 10 seconds through a screened original by means of a 5 kW metal halide lamp at a distance of 110 cm. The resulting contrast was evaluated prior to development.

Evaluation of the image contrast after exposure, prior to development:

| | immediately | after 20 min | after 24 hours |
| --- | --- | --- | --- |
| (a) | no image | no image | no image |
| (b) | good image | good image | faint image |
| (c) | no image | acceptable image | acceptable image |
| (d) | good image | good image | acceptable image |

When the printing plates were developed immediately after exposure, using a developer comprised of
15 p.b.w. of pelargonic acid,
10 p.b.w. of sodium hydroxide,
92 p.b.w. of a block polymer comprising 90 % of propylene oxide and 10% of ethylene oxide,
12 p.b.w. of sodium tetrapolyphosphate, and
550 p.b.w. of water,
sample (d), prepared according to the present invention, exhibited an image having good contrast, comparative samples (c) and (b) exhibited an image of weak contrast, and comparative sample (a) showed no contrast whatever. A field could be detected only where exposed and unexposed areas were distinguishable from one another by slight differences in surface gloss.

EXAMPLE 3

Coating solutions comprised of
30 p.b.w. of the reaction product obtained from 1 mole of 2,2,4-trimethyl-hexamethylene diisocyanate and 2 moles of 2-hydroxy-ethylmethacrylate,
10 p.b.w. of polyethylene glycol dimethacrylate (average molecular weight of the polyethylene glycol 550),
60 p.b.w. of a terpolymer obtained from methylmethacrylate, n-hexylmethacrylate and methacrylic acid (10:60:30) having an acid number of 190, and 1 p.b.w. of 9-acetylamino-acridine, in
60 p.b.w. of ethanol and
125 p.b.w. of butanone,
which were used (a) without an admixture or with an admixture of
(b) 2 p.b.w. of leuco malachite green or
(c) 1 p.b.w. of 1',3',3'-trimethyl-6-nitro-spiro[2H-1 benzopyran-2,2'-indoline] or
(d) 2 p.b.w. of leuco malachite green and 1 p.b.w. of 1',3',3'-trimethyl-6-nitro-spiro[2H-1-benzopyran-2,2'-indoline] or
(e) 2 p.b.w. of leuco malachite green and 0.5 p.b.w. of 1',3',3'-trimethyl-6-nitro-8-methoxy-spiro-[2H-1-benzopyran-2,2'-indoline], were applied to 25 μm-thick polyethylene terephthalate film and dried (dry layer weight: 45 g/m²). The dry resist layers thus prepared were laminated to precleaned copper foil, which had been bonded to rigid epoxide/glass fiber laminate, and subsequently exposed through an original (5 kW metal halide lamp; distance 90 cm; 10 seconds).

The surfaces subjected to imagewise exposure were then evaluated. The results are compiled in the table below:

|   | immediately after exposure | after 60 min | after 24 hours |
|---|---|---|---|
| (a) | no image | no image | no image |
| (b) | no image | very faint image | acceptable image |
| (c) | acceptable image | faint image | very faint image |
| (d) | acceptable image | acceptable image | acceptable image |
| (e) | good image | good image | acceptable image |

It was possible without any problems to develop the exposed plates 3a–3e with 0.8 % strength sodium carbonate solution and to reinforce the bared copper surface by electroplating.

EXAMPLE 4

A coating solution comprised of
40 p.b.w. of a copolymer of methylmethacrylate and methacrylic acid (acid number 115),
40 p.b.w. of 1,1,1-trimethylolethane triacrylate,
1 p.b.w. of 6,4',4''-trimethoxy-2,3-diphenylquinoxaline,
2 p.b.w. of leuco crystal violet,
0.5 p.b.w. of 1',3',3'-trimethyl-5'-chloro-6-nitro-8-methoxy-spiro[2H-1-benzopyran-2,2'-indoline], and
520 p.b.w. of 2-methoxyethanol, was coated onto electrolytically grained and anodically oxidized aluminum foil (dry layer weight: 3.4 g/m²). Then a covering layer (4 g/m²) of polyvinyl alcohol was applied to the plate.

The printing plate thus obtained was exposed through an original for 30 seconds by means of a 5 kW metal halide lamp and then wiped for 1 minute with a developer of
15 p.b.w. of sodium metasilicate×9H₂O,
3 p.b.w. of polyglycol 6000,
0.6 p.b.w. of levulinic acid, and
0.3 p.b.w. of strontium hydroxide×8H₂O, in
1,000.0 p.b.w. of water, whereby the unexposed portions of the layer were removed. Prior to and after development, a sharp, high-contrast, negative image of the original was visible on the plate.

The plate was then inked with black greasy ink. A printing test was stopped after 100,000 perfect prints had been run.

What is claimed is:
1. A photopolymerizable composition comprising
(a) a polymeric binder;
(b) a compound that has at least one terminal ethylenic double bond and a boiling temperature, at standard pressure, of above 100° C., and that can form a polymer by polymerization initiated by a free-radical process;
(c) a photoinitiator;
(d) a leuco base of a triarylmethane dye; and
(e) a photochromic spiro-indolino-benzopyran compound represented by the formula

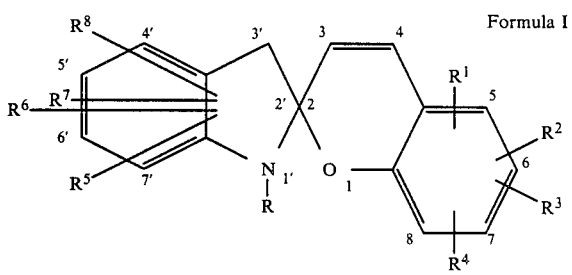

Formula I wherein
R denotes a hydrogen atom or a $C_1$-to-$C_{16}$ alkyl group,
$R^1$, $R^2$, $R^3$ and $R^4$ are identical or different, and each denotes a hydrogen or a halogen atom, a $C_1$-to-$C_4$ alkyl or alkoxy group, or a nitro group, and
$R^5$, $R^6$, $R^7$ and $R^8$ are identical or different, and each denotes a hydrogen or a halogen atom, a nitro or an amino group, a $C_1$- to-$C_5$ alkyl or alkoxy group, or a $C_6$-to-$C_{10}$ aryl group.

2. A photopolymerizable composition as in claim 1, wherein at least one of the groups $R^1$, $R^2$, $R^3$ and $R^4$ is a nitro group.

3. A photopolymerizable composition as in claim 2, wherein compound (e) has a nitro group at the 6 position of said formula.

4. A photopolymerizable composition as in claim 3, wherein compound (e) has an alkoxy group at the 8 position of said formula.

5. A photopolymerizable composition as in claim 1, wherein three substituents of the group consisting of $R^5$, $R^6$, $R^7$ and $R^8$ are methyl.

6. A photopolymerizable composition as in claim 5, wherein compound (e) has one methyl substituent at position 1', and two methyl substituents at position 3', of said formula.

7. A photopolymerizable composition as in claim 1, wherein said leuco base is a tris-(4-dialkylaminophenyl)methane compound.

8. A photopolymerizable composition as in claim 1, wherein (i) said leuco base is present in an amount ranging between about 0.05 and 5.0 percent by weight and (ii) said compound (e) is present in an amount ranging between about 0.01 and 2.0 percent by weight.

9. A photopolymerizable composition as in claim 1 wherein said photoinitiator is a heterocyclic compound having two to five fused rings and at least one nitrogen atom as a heteroatom.

10. A photopolymerizable composition as in claim 9, wherein said photoinitiator is a derivative of quinoline, quinoxaline, phenazine or acridine, and is represented by one of the following formulas

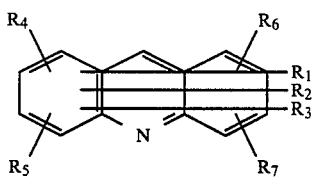

Formula II or

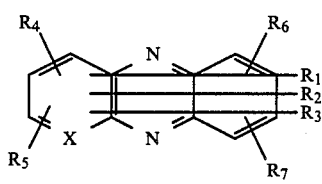

Formula III in which $R_1$, $R_2$, and $R_3$ are selected from the group consisting of hydrogen, halogen, alkyl, alkoxy, aryl, aryloxy, amino, acylamino, and aralkeny groups, $R_4$, $R_5$, $R_6$ and $R_7$ are H or annelated benzene rings, with no more than two annelated benezene rings being present per molecule, however, and X is selected from the group consisting of N and

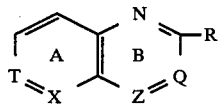

Formula IV in which

Z and Q are different from one another and each represents either a nitrogen atom or the group C—R', X and T are the same or different and represent a nitrogen atom or the group C—R", R and R' are the same or different and represent aliphatic, aromatic or heterocyclic groups and R" represents hydrogen or an organic group of the nucleus A carrying a further group of the significance of R" or an annellated benzene ring; or,

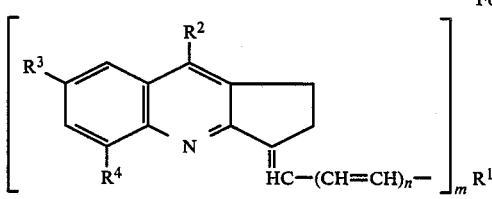

Formula V in which $R^1$ is a substituted or unsubstituted m-valent, carbocyclic aromatic or heterocyclic aromatic radical, $R^2$ is an alkyl group, an aryl group, an aralkyl group or an aralkenyl group, $R^3$ and $R_4$ are identical or different, and each denotes a hydrogen atom, a halogen atom, an alkyl group or an alkoxy group, n is 0 or 1, and m is 1 or 2.

11. A photopolymerizable composition as in claim 1, wherein said polymeric binder is insoluble in water and soluble in an aqueous-alkaline solution, 12. A photopolymerizable composition as in claim 11, wherein said polymeric binder has an acid number of 50 to 350.

13. A photopolymerizable recording material comprised of a layer support and a photopolymerizable layer provided on said layer support, said layer comprising
   (a) a polymeric binder;
   (b) a compound that has at least one terminal ethylenic double bond and a boiling temperature, at standard pressure, of above 100° C., and that can form a polymer by polymerization initiated by a free-radical process;
   (c) a photoinitiator;
   (d) a leuco base of a triarylmethane dye; and
   (e) a photochromic spiro-indolino-benzopyran compound represented by the formula

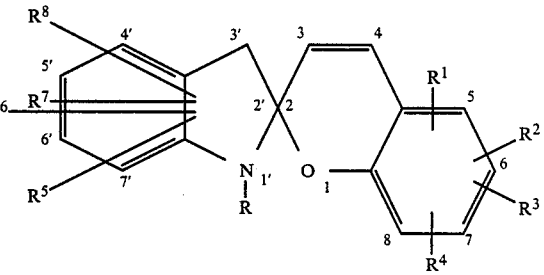

wherein

R denotes a hydrogen atom or a $C_1$-to-$C_{16}$ alkyl group, $R^1, R^2, R^3$ and $R^4$ are identical or different, and each denotes a hydrogen or a halogen atom, a $C_1$-to-$C_4$ alkyl or alkoxy group, or a nitro group, and $R^5, R^6, R^7$ and $R^8$ are identical or different, and each denotes a hydrogen or a halogen atom, a nitro or an amino group, a $C_1$-to-$C_5$ alkyl or alkoxy group, or a $C_6$-to-$C_{10}$ aryl group.

14. Recording material as in claim 13, wherein said photopolymerizable layer is provided on a surface of said layer support that is comprised of copper or a copper alloy.

15. A process for recording relief images, comprising the steps of (a) imagewise-exposing a photopolymerizable recording material as claimed in claim 13, whereby a colored image is formed; (b) checking the correctness of the exposure of said recording material by reference to said colored image; and (c) washing out the unexposed portions of said layer.

16. A photopolymerizable composition as in claim 9, wherein said photoinitiator is at least one compound selected from the group consisting of 9-phenylacridine, 9-p-methoxyphenylacridine, 9-acetylaminoacridine, benz(a)acridine, 2-styrylquinoline, cinnamylidenequinaldine, 9,10-dimethyl-benz(a)phenazine, 10-methoxybenz(a)phenazine, 6,4',4''-trimethoxy-2,3-diphenylquinoxaline and 4', 4''-dimethoxy-2,3-diphenyl-5-azaquinoxaline.

* * * * *